United States Patent
Lee et al.

(10) Patent No.: US 7,592,565 B2
(45) Date of Patent: Sep. 22, 2009

(54) PROBE POSITIONING AND BONDING DEVICE AND PROBE BONDING METHOD

(75) Inventors: Oug-Ki Lee, A/12 Green Villa, 1-5, Hang-dong, Guro-gu, Seoul, 152-140 (KR); Jung-Hoon Lee, Kunpo-shi (KR)

(73) Assignees: Phicom Corporation (KR); Oug-Ki Lee (KR)

( * ) Notice: Subject to any disclaimer, the term of this patent is extended or adjusted under 35 U.S.C. 154(b) by 365 days.

(21) Appl. No.: 10/549,418

(22) PCT Filed: Mar. 16, 2004

(86) PCT No.: PCT/KR2004/000560

§ 371 (c)(1),
(2), (4) Date: Sep. 14, 2005

(87) PCT Pub. No.: WO2004/084296

PCT Pub. Date: Sep. 30, 2004

(65) Prior Publication Data

US 2006/0169678 A1    Aug. 3, 2006

(30) Foreign Application Priority Data

Mar. 17, 2003 (KR) .................. 10-2003-0016635

(51) Int. Cl.
*B23K 26/00* (2006.01)
(52) U.S. Cl. .................. 219/121.63; 228/4.5
(58) Field of Classification Search ............ 219/121.63; 228/4.5
See application file for complete search history.

(56) References Cited

U.S. PATENT DOCUMENTS 3,383,491 A * 5/1968 Muncheryan .......... 219/121.63

(Continued)

FOREIGN PATENT DOCUMENTS

JP    60-247847    7/1985

(Continued)

OTHER PUBLICATIONS

PCT/KR2004/000560 International Search Report dated Jul. 6, 2004.

(Continued)

*Primary Examiner*—Stanley Silverman
*Assistant Examiner*—Nicholas P D'Aniello
(74) *Attorney, Agent, or Firm*—Daly, Crowley, Mofford & Durkee, LLP (57) ABSTRACT

Disclosed herein are a probe positioning and bonding device and a probe bonding method, and more particularly a probe positioning and bonding device used to fix probes to prescribed positions on a substrate so that a probe card used for semiconductor integrated circuit testing equipment is manufactured, and a probe bonding method using the same. The probe positioning and bonding device comprises a stage unit disposed on a working table, a microscope disposed above the stage unit while being supported by means of a first supporting member disposed on the working table, a probe fixing unit disposed above the stage unit and below the microscope while being supported by means of a second supporting member disposed on the working table, and a light source unit supported by means of a third supporting member disposed on the working table. The light source unit is disposed toward the upper part of the stage unit.

12 Claims, 6 Drawing Sheets

U.S. PATENT DOCUMENTS

| | | | |
|---|---|---|---|
| 4,141,456 | A | 2/1979 | Hart |
| 4,182,024 | A | 1/1980 | Cometta |
| 4,475,681 | A * | 10/1984 | Ingle .......................... 228/4.5 |
| 5,144,630 | A | 9/1992 | Lin |
| 5,151,909 | A | 9/1992 | Davenport et al. |
| 5,231,263 | A | 7/1993 | Kuwabara et al. |
| 5,341,236 | A | 8/1994 | Stappaerts |
| 5,811,751 | A | 9/1998 | Leong et al. |
| 6,023,172 | A * | 2/2000 | Krivy .......................... 324/756 |
| 6,163,010 | A * | 12/2000 | Kobsa .................... 219/121.61 |

FOREIGN PATENT DOCUMENTS

| | | |
|---|---|---|
| JP | 02-003253 | 1/1990 |
| JP | 05-192779 | 8/1993 |
| JP | 05-251524 | 9/1993 |
| JP | 07-202347 | 8/1995 |
| JP | 10-500628 | 1/1998 |
| KR | 1989-0004245 | 6/1989 |
| WO | WO 02/061505 A1 | 8/2002 |

OTHER PUBLICATIONS

PCT/KR2004/000560 Written Opinion of the International Searching Authority dated Jul. 6, 2004.

Korean Office Action, Apr. 12, 2004.

KIPO Office Action dated Apr. 12, 2004, Korean Application No. 10-2003-0016635, 2 pages.

JP Office Action dated Sep. 30, 2008, Korean Application No. 10-2003-0016635, 4 pages.

* cited by examiner

PROBE POSITIONING AND BONDING DEVICE AND PROBE BONDING METHOD

CROSS-REFERENCE TO RELATED APPLICATIONS

This application is a National Stage application under 35 U.S.C. §371 of and claims the benefit of International Application No. PCT/KR2004/000560 filed on Mar. 16, 2004, which claims priority to Korean Application No. 10-2003-0016635, filed on Mar. 17, 2003, which is hereby incorporated by reference.

TECHNICAL FIELD

The present invention relates to a probe positioning and bonding device and a probe bonding method, and more particularly to a probe positioning and bonding device used to fix probes to prescribed positions on a probe card substrate, and a probe bonding method using the same.

BACKGROUND ART

Generally, semiconductor integrated circuit devices are tested when manufacturing the devices, after manufacturing the devices, or when packaging the devices, in order to verify whether the devices are manufactured while the whole or partial electric characteristics of the devices exactly correspond to the original design of the devices.

The equipment for performing the above-mentioned test is probe equipment with a test apparatus and a probe card. The probe card serves to electrically connect a various electrical signals-generating part in the test apparatus and a pad in the semiconductor integrated circuit device, or an electric signal detecting part in the test apparatus and the pad in the semiconductor integrated circuit device.

Figure 1A:
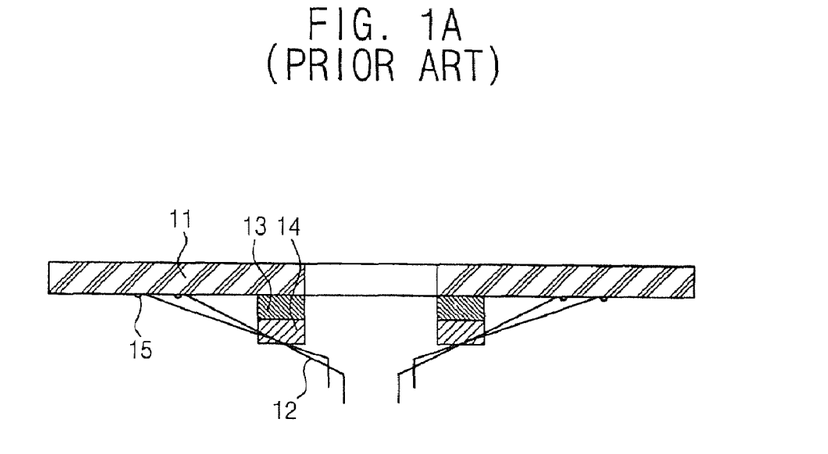
FIGS. 1a and 1b are a partial cross-sectional view and a plan view respectively showing an example of the conventional probe card.
Figure 1B:
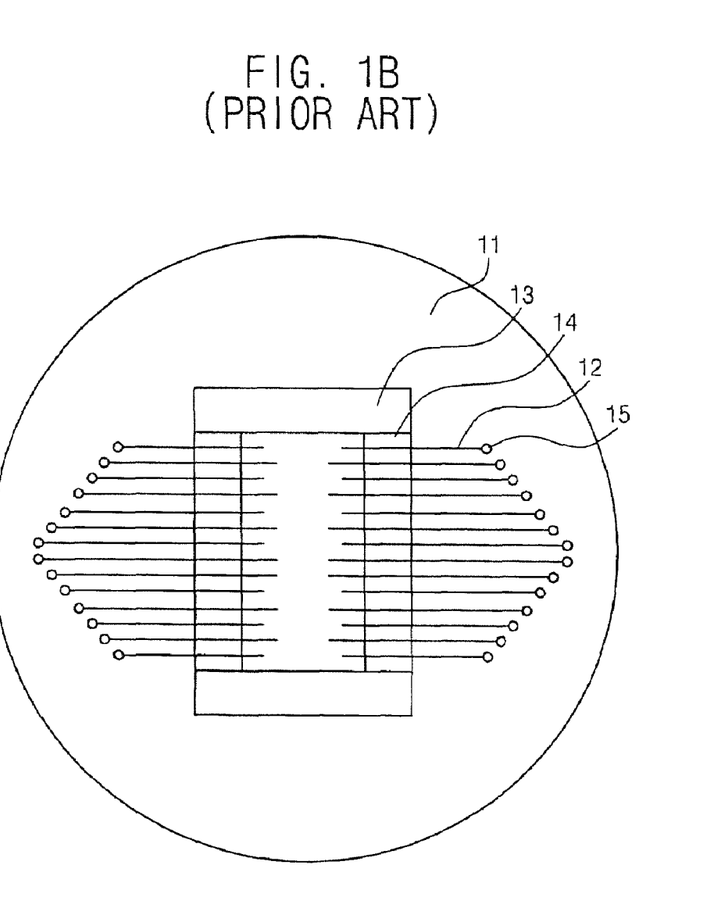

One of the conventional probe cards is a needle-type probe card, which is shown in FIG. 1a. As shown in FIG. 1b, the needle-type probe card includes needle-type probes 12 each having a bent end. The body of each needle-type probe 12 is disposed on a prescribed position of a ceramic 13, and is then fixedly attached to the ceramic 13 by means of epoxy 14. The ceramic 13 is attached to a main circuit board 11. The other end of the needle-type probe 12 is connected to a prescribed circuit of the main circuit board 11 by means of soldering 15. In this way, the needle-type probe card is prepared. However, the above-mentioned needle-type probe card has a relatively large size or space. Consequently, the needle-type probe card is not suitable to test small-sized electronic elements, which are gradually miniaturized according to the advancement of the technology. Furthermore, there is created interference between the adjacent needle-type probes when needle-type probes are densely disposed on the main circuit board. As a result, there is generated noise when a high-frequency signal is transmitted, and thus an imprecise test is performed.

Figure 2A:
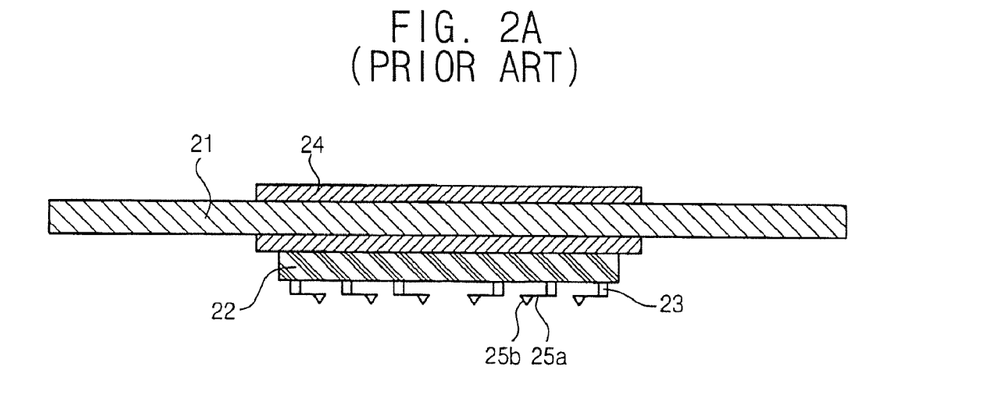
FIG. 2a is a cross-sectional view showing another example of the conventional probe card.

In order to overcome the above-mentioned drawback of the needle-type probe card, there has been developed a cantilever-type probe card. As shown in FIG. 2a, a bump 23 is formed on the surface of a substrate 22 fixedly attached to a supporting member 21 by means of a connection member 24. To the end of the bump 23 is bonded one end of a supporting beam 25a. The supporting beam 25a is provided at the other end thereof with a probe tip 25b.

Figure 2B:
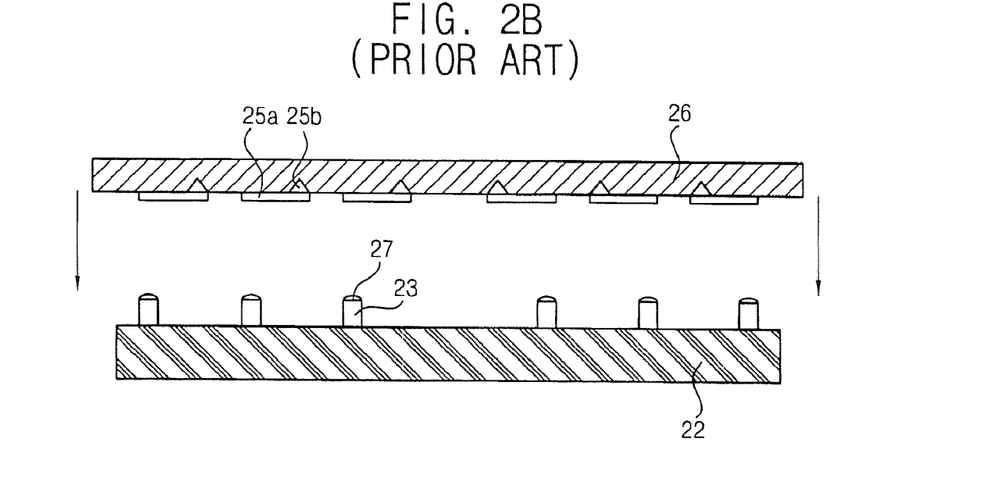

The above-mentioned cantilever-type probe card is manufactured as shown in FIG. 2b. On the surface of a silicon wafer 26 are formed the supporting beam 25a and the probe tip 25b. On the surface of the substrate 22 is formed the bump 23, and epoxy 27 is applied to the upper end of the bump 23. Here, the probe tip 25b and the supporting beam 25a are formed by means of photolithography and plating in order to process the silicon wafer 26. The bump 23 is formed on the surface of the substrate 22 by means of photolithography and plating in order to process the substrate 22. The epoxy 27 is applied to the upper end of the bump 23.

In the silicon wafer 26 and the substrate 22 manufacture as described above, one end of the supporting beam 25a is connected to the upper end of the bump 23, and then the attached supporting beam and the bump are heated to a temperature of approximately 350° C. The supporting beam 25a is fixedly attached to the bump 23, as the epoxy 27 is molten. Subsequently, the silicon wafer is removed by means of etching.

Figure 2C:
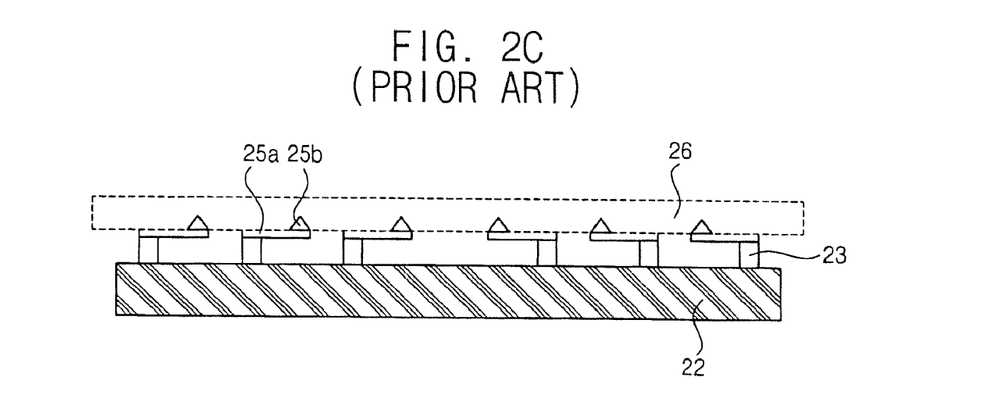

However, the cantilever-type probe card manufactured as described above has the following drawbacks. First, it is difficult to verify with the naked eye, from the outside, whether the probe tip 25b is fixedly attached to the supporting beam 25a in the case that the photolithography and plating method are applied to the silicon wafer 26. As a result, it can be verified whether the probe tip 25b is fixedly attached to the supporting beam 25a only after the process of FIG. 2c is finished. Consequently, defective probe cards may be produced in large quantities.

Second, the material of the substrate is mainly restricted to a ceramic material since the heating is carried out at high temperature, i.e., approximately 350° C., to fixedly attach the bump 23 of the silicon wafer 26 to the supporting beam 25a of the substrate 22. Consequently, the unit production cost of the probe card is increased.

Third, there occurs heat expansion and heat contraction when the substrate 22 and the silicon wafer 26 are heated and cooled. Consequently, positional error is generated by difference of high-temperature heat expansion at the attached parts due to differences of heat expansion coefficients between the silicon wafer 26 and the substrate 22 made of the ceramic, and there occurs a shearing force due to residual stress when the substrate and the silicon wafer are cooled, with the result that separation between the supporting beam 25a and the bump 23 may be caused.

Finally, it is required that different kinds of photolithography be performed on the basis of objects to be tested, which have various arrangements (i.e., arrangements of pads on an element) when the above-mentioned probe card is manufactured. Consequently, compatibility of the probe card depending upon the change of the pad arrangements is poor.

DISCLOSURE OF THE INVENTION

Therefore, the present invention has been made in view of the above problems, and it is an object of the present invention to provide a probe positioning and bonding device and a probe bonding method that are capable of manufacturing a probe card at a normal temperature, using various kinds of materials to reduce the cost of the probe card, and minimizing damage to probes due to generation of residual stress caused by heat expansion and heat contraction.

It is another object of the present invention to provide a probe positioning and bonding device and a probe bonding method that can be applied even when pad arrangement of an object to be tested is changed.

In accordance with one aspect of the present invention, the above and other objects can be accomplished by the provision of a probe positioning and bonding device comprising: a stage unit disposed on a working table; a microscope disposed above the stage unit while being supported by means of a first supporting member disposed on the working table; a probe fixing unit disposed above the stage unit and below the microscope while being supported by means of a second supporting member disposed on the working table; and a light source unit supported by means of a third supporting member disposed on the working table, the light source unit being disposed toward the upper part of the stage unit.

In accordance with another aspect of the present invention, there is provided a probe bonding method comprising: a step 1 for disposing a substrate having a bonding agent applied to a prescribed area thereof on a stage, and operating the stage to place a prescribed point of the substrate on the focal point of the microscope having the fixed position; a step 2 for fixedly placing the probe on the focal point of the microscope to contact the probe to the prescribed point on the substrate; and a step 3 for emitting a laser beam to the connected parts of the prescribed point and the probe to bond the probe on the substrate, wherein a plurality of probes are bonded on the substrate by successively repeating the steps 1 to 3 so that the probes having a prescribed arrangement are formed on the substrate.

BRIEF DESCRIPTION OF THE DRAWINGS

The above and other objects, features and other advantages of the present invention will be more clearly understood from the following detailed description taken in conjunction with the accompanying drawings, in which:

FIGS. 2b and 2c are cross-sectional views respectively illustrating the manufacturing steps of the probe card shown in FIG. 2a;

BEST MODE FOR CARRYING OUT THE INVENTION

Figure 3:
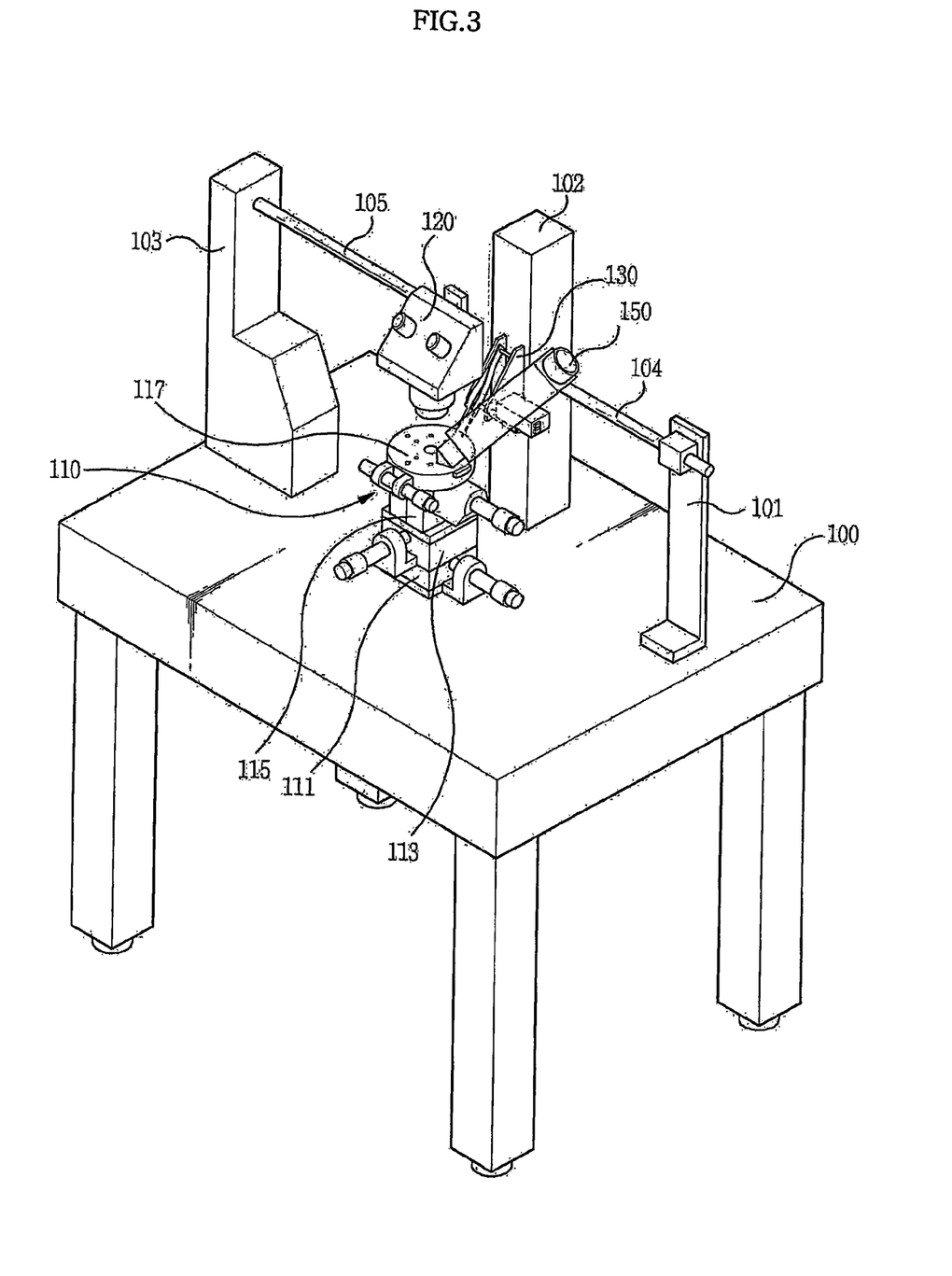
FIG. 3 is a perspective view showing a probe positioning and bonding device according to a preferred embodiment of the present invention.

As shown in FIG. 3, a probe positioning and bonding device according to the present invention comprises: a working table 100; a plurality of supporting members 101, 102, and 103 disposed on the working table 100; arranging members 104 and 105 connected to the supporting members 101 and 103 and disposed horizontally; a stage unit 110 disposed at the center part on the working table 100; a microscope 120 attached to the arranging member 105 while the microscope is positioned above the stage unit 110, the microscope being supported by means of the supporting member 103; a probe fixing unit 130 attached to the supporting member 102 while being supported by means of the supporting member 102 such that one end of the probe fixing unit 130 is positioned at the center part of the upper surface of the stage unit 110; a light source unit 150 attached to the arranging member 104 while being supported by means of the supporting member 101 such that the light source unit 150 is directed to the center part of the upper end of the stage unit 110.

The working table 100 has a prescribed height from the floor so that other parts of the probe positioning and boding device according to the present invention are disposed on the working table while being securely fixed to the working table. The plurality of supporting members 101, 102, and 103 are disposed at both ends of the working table 100 and at the rear middle part of the working table 100, respectively. To the upper parts of the supporting members 101 and 103 are attached the arranging members 104 and 105 while being horizontally connected to each other such that the microscope 120 and the light source unit 150 are disposed on the arranging members, respectively.

The stage unit 110 is disposed at the center part of the upper surface of the working table 100. The stage unit comprises: an x-axis moving stage 111; a y-axis moving stage 113; a z-axis moving stage 115; and a rotating stage 117, which are vertically disposed one on another from bottom to top. Each stage is provided with a control knob. Upon rotation of the control knobs, the rotating stage 117, which is disposed at the uppermost end of the stage unit, is placed on a working position, or separated from the working position after each probe is bonded.

The microscope 120 is attached to one end of the arranging member 105 such that the microscope is placed above the stage unit 110 while being spaced a prescribed distance from the stage unit, as shown in FIG. 3. An objective lens is moved vertically by means of the microscope 120. Preferably, an eye lens of the microscope 120 has a cross line marked thereon to confirm the positions of the substrate and the probes so that the probes are arranged on the substrate or bonded to the substrate on the basis of the cross line. The microscope 120 may be disposed at the front middle part of the working table 100. In this case, the process of bonding the probes can be observed from the above.

Figure 4A:
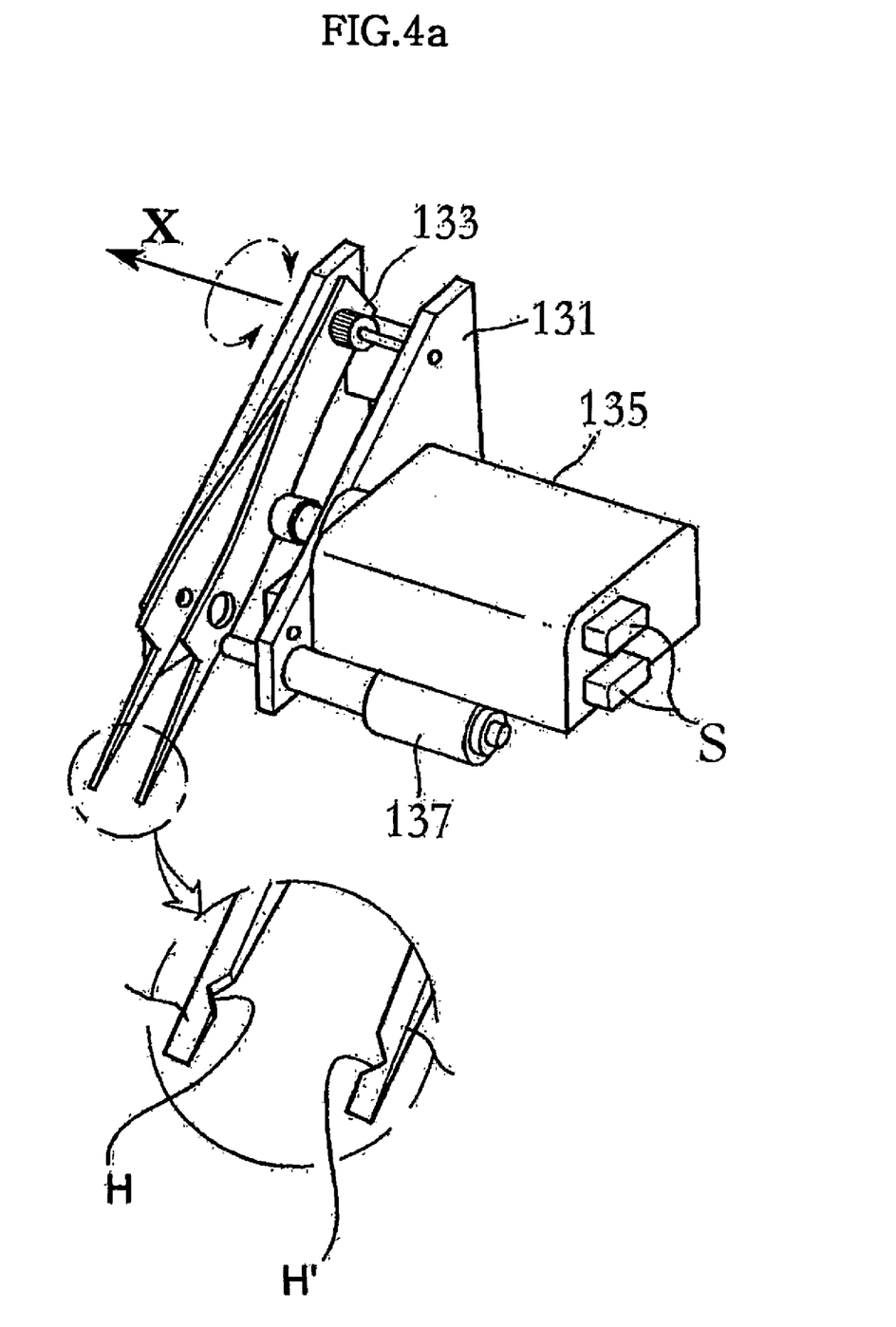
FIGS. 4a and 4b are a perspective view and a front view, in section, showing a probe fixing unit of the probe positioning and boding device shown in FIG. 3.
Figure 4B:
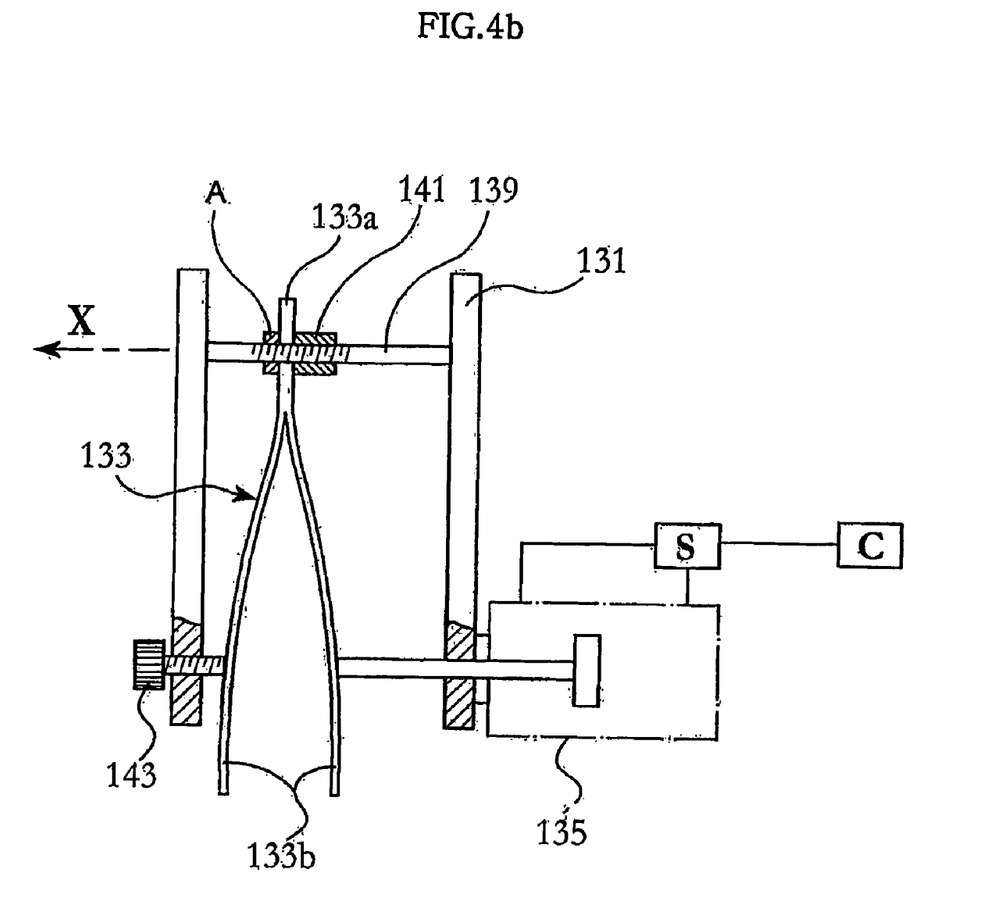

The probe fixing unit 130 is mounted to the side wall of the supporting member 102, as shown in FIG. 3. One end of the probe fixing unit 130 is placed at the center part of the rotating stage 117, which is the uppermost part of the stage unit 110. As shown in FIGS. 4a and 4b, the probe fixing unit 130 comprises: a bracket 131 fixed to the supporting member; a pincette 133 disposed inside the bracket 131; a reciprocating mover 135 for operating the pincette 133; and an open angle controller 137 for controlling an open angle of the pincette 133.

As shown in FIG. 4b, the pincette 133 has a head part 133a supported by means of the bracket 131 by means of a fixed shaft member 139. On the fixed shaft member 139 is formed a thread. The head part 133a of the pincette 133 is engaged with the thread of the fixed shaft member 139 by means of an adjusting member 141. Consequently, the pincette 133 can be moved in the direction indicated by the arrow X upon rotation of the adjusting member 141.

At the lower ends of both side plates of the bracket 131 are disposed the open angle controller 143 and the reciprocating mover 135, respectively, so that the open angle of gripping parts 133b of the pincette 133 is controlled, as shown in FIG. 4b. The left gripper of the gripping part 133b of the pincette 133 is fixed by means of the open angle controller 143. Furthermore, the open angle of the gripping parts is limited to a prescribed range by means of the open angle controller 143. The reciprocating mover 135 applies pressure to the right gripper of the gripping parts 133b so that the distance between the gripping parts 133b is increased or decreased. As shown in FIG. 4a, the gripping parts 133b of the pincette 133 have grooves H and H' formed at the insides of the lower ends thereof, respectively, so that the probe is easily gripped by means of the gripping parts.

The reciprocating mover 135 is a piston apparatus, which is operated by means of an air compressor C or electrically operated by means of a solenoid (not shown). The detailed construction of the reciprocating mover will not be described. The operation of the reciprocating mover 135 is carried out by means of a button switch S disposed at one side thereof. An additional damper (not shown) may be mounted to control the operating speed of the reciprocating mover 135.

The probe fixing unit 130 may be further provided with a stage (not shown) connected to the bracket such that the stage is vertically slid on the second supporting member. In this case, the probe fixing unit 130 is moved upward without operation of the stage unit 110 so that a new probe is gripped by means of the pincette 133 when each probe has been bonded.

The light source unit 150 is movably disposed on the arranging member 104. The light source unit 150 is provided with a laser source. Consequently, a laser beam is emitted through the lens so that a bonding operation between the substrate and the probe is carried out by means of the generated heat.

The operation of the probe positioning and bonding device with the above-stated construction according to the present invention is as follows: Epoxy is applied to the surface of the probe card substrate so that an epoxy layer is formed. After the stage unit 110 is lowered a prescribed distance, the substrate is placed on the upper surface of the rotating stage 117 of the stage unit 110. The probe is inserted into the grooves H and H' of the pincette 133, and is then fixed to the pincette upon operation of the switch S. Subsequently, the lower end of the probe fixed to the pincette 133 is connected to a prescribed part of the substrate, to which the probe is to be bonded. In this course, the moving stages 111, 113, and 115, and the rotating stage 117 of the stage unit 110 are arranged at prescribed positions and in prescribed directions. The light source unit 150 is operated so that the generated laser is emitted to the substrate, to which the probe is connected. The epoxy on the surface of the substrate is molten by means of the emitted laser. Consequently, the probe is bonded. The above-mentioned processes are repeatedly carried out for each probe. In this way, a probe card is manufactured.

Figure 5:
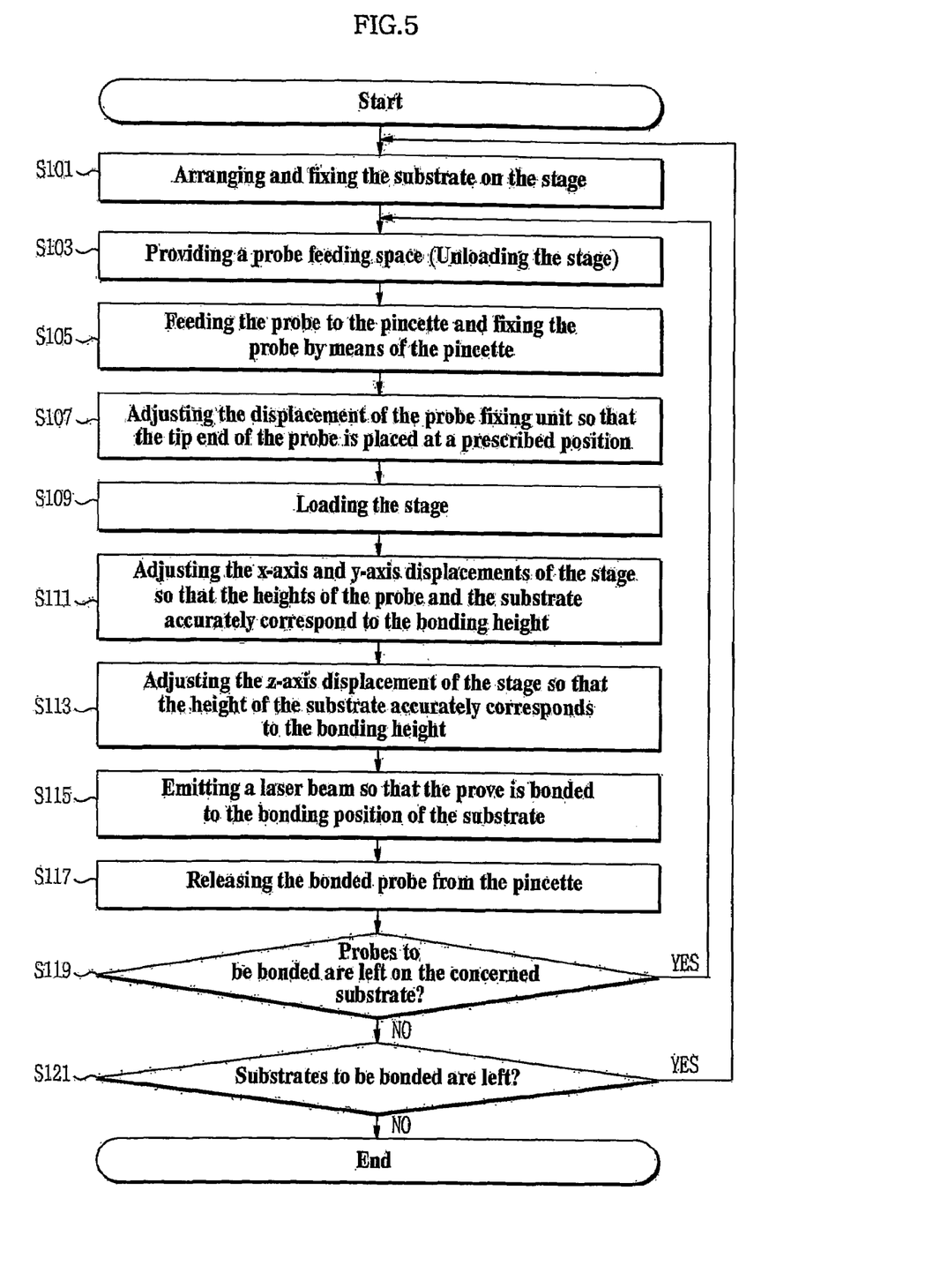
FIG. 5 is a flow chart illustrating a probe bonding method according to a preferred embodiment of the present invention.

The above-mentioned probe bonding process will now be described in more detail with reference to FIG. 5, which is a flow chart illustrating the probe bonding method according to a preferred embodiment of the present invention.

Step 1 is a processing step carried out by means of the stage unit 110 and the microscope 130. Specifically, step 1 is a step for disposing the substrate, to which the probes are bonded, on the stage unit 110 and for arranging and fixing the substrate on the stage unit 110 through a focusing operation on the substrate disposed on the stage unit 110 while verifying the position of the substrate by means of the microscope 130 (S101).

Step 2 is a step for unloading the stage unit 110, on which the substrate is fixed at the step 1, to a non-working position to provide a working space for a probe feeding operation (S103).

Step 3 is a step for feeding the probe to the pincette 133 of the probe fixing unit 130 using the space provided by means of the processing carried out at step 2 so that the probe is fixed. Specifically, step 3 comprises: a step for holding the probe with the pincette 133 of the probe fixing unit 130 while the probe is maintained at a prescribed angle (S105); and a step for controlling the reciprocating mover 135 of the pincette 133 and the open angle controller 143 so that the tip end of the probe fixing by means of the probe fixing unit 130 is placed on the cross line formed at the objective lens of the microscope 120 to arrange the probe (S107).

Step 4 comprises: a step for loading the stage unit 110, which is unloaded to the non-working position at step 2 to provide a working space for a probe feeding operation, to a home position where the operation of the stage unit 110 is carried out (S109); and a step for adjusting the displacement and rotating angle of the stage unit 110 loaded to the home position at the x and y plane on three-dimensional coordinates to accurately place the probe fixed by means of the pincette 133 to the coordinates of the substrate, to which the probe is to be bonded (S111).

Step 5 is a step processed by means of the stage unit 110. Specifically, step 5 is a step for controlling the vertical displacement of the stage unit 110 to accurately position the stage unit to the substrate height for probe bonding (S113).

Step 6 is a step processed by means of the light source unit 150. Specifically, step 6 is a step for emitting a laser beam to the connected parts of the substrate, which is accurately positioned at step 5, and the probe, to bond the probe to the position to be bonded on the substrate (S115).

Step 7 is a step processed by means of the probe fixing unit 130. Specifically, step 7 is a step for stopping the supply of power, i.e., electricity or air, to the reciprocating mover 135 to separate the bonded probe held by means of the pincette 133 from the probe fixing unit (S117).

Step 8 is a step for successively repeating the assembly steps carried out at the steps 1 to 7 (S119 and S121). At step 8, it is verified whether probes to be bonded or substrates to be bonded are left to determine whether the assembly steps are to be repeatedly carried out or not.

According to the probe bonding method as described above, a plurality of probes are assembled to a probe card by means of a bonding process, whereby the probe card is manufactured.

With the probe positioning and bonding device and the probe bonding method, it is not necessary to heat the whole substrate at high temperature so that the probes are bonded, unlike the conventional art. Consequently, materials for the substrate are not restricted. Specifically, the material for the substrate is not restricted to ceramic. For example, a synthetic resin may be used for the substrate. Also, it is not necessary to modify the bonding device or the bonding method even when the arrangement of the probes on the probe card is changed. Consequently, the compatibility of the bonding device and method is distinguished. Furthermore, occurrence of errors caused during the probe bonding process is decreased since the probe bonding process is verified by means of the microscope.

INDUSTRIAL APPLICABILITY

As apparent from the above description, the present invention provides a probe positioning and bonding device and a probe bonding method that are capable of manufacturing a probe card at normal temperature, using various kinds of materials to reduce the cost of the probe card, and minimizing damage to probes due to generation of residual stress caused by heat expansion and heat contraction.

Furthermore, the probe card can be easily manufactured even when pad arrangement of pads of an element to be tested is changed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An apparatus for positioning and bonding probes to a substrate of a probe card, comprising:
   a stage unit on a working table, the stage unit being movable in three dimensions and supporting the substrate;
   a microscope coupled to a first guide member positioned at a first portion of the working table and placed above the stage unit;
   a probe fixing unit mounting on a supporting member in such a configuration that the probe fixing unit moves on the supporting member vertically to the working table, an end portion of the probe fixing unit to which a probe is fixed being interposed between the microscope and the stage unit so that the probe makes contact with the substrate at a connected portion thereof; and
   a light source unit movably coupled to a second guide member positioned at a second portion of the working table, a laser being emitted to the connection portion of the substrate from the light source unit, to thereby bonding the probe to the substrate at the connection portion of the substrate,
   wherein the probe fixing unit includes:
      a bracket moveably secured to the supporting member and including a pair of plates and a shaft interposed between the plates;
      a pincette moveably secured to the bracket and including a head portion secured to the bracket and a gripping portion opposite to the head portion to which the probe is fixed, the head portion of the pincette being secured to the shaft in a space between the plates; and
      a controller for controlling an open angle of the pincette, the controller positioned at a side of the pincette and applying a pressure to the pincette.

2. The apparatus of claim 1, wherein the stage unit includes an x-axis moving stage, a y-axis moving stage and a z-axis moving stage moving in an x-axis direction, a y-axis direction and a z-axis direction in a Cartesian coordinate system and a rotating stage rotated about the z-axis direction, and the x-axis moving stage, the y-axis moving stage, the z-axis moving stage and the rotating stage are vertically disposed one and another from bottom to top.

3. The apparatus of claim 2, wherein the substrate is positioned on the stage unit by three-dimensional movement of the stage unit in such a configuration that the connected portion of the substrate corresponds to the probe gripped to the end portion of the probe fixing unit, and the position of the substrate is verified by the microscope.

4. The apparatus of claim 1, wherein the probe includes a supporting beam and a probe tip positioned on a first end portion of the supporting beam, and the supporting beam of the probe is bonded to the connected portion of the substrate and the probe tip faces outwards.

5. The apparatus of claim 4, wherein the probe fixing unit moves vertically on the supporting member upward without movement of the stage unit, so that another probe is gripped by the probe fixing unit without change of the position of the substrate on the stage unit.

6. The apparatus of claim 1, wherein the first guide member includes a first supporting member fixed to the first portion of the working table and a first arranging member extending from an end portion of the first supporting member in a first direction and the second guide member includes a second supporting member fixed to the second portion of the working table and a second arranging member extending from an end portion of the second arranging member in a second direction opposite to the first direction, and the microscope is coupled to the first arranging member over the stage unit and the light source unit is mounted onto the second arranging member movably along the second arranging member close to or away from the microscope unit.

7. The apparatus of claim 6, wherein the first and second guide members are positioned at both sides of the stage unit on the working table and the probe fixing unit supporting member is positioned on a backside of the stage unit on the working table.

8. The apparatus of claim 1, wherein the gripping portion of the pincette includes a pair of grooves facing each other to which the probe is gripped.

9. The apparatus of claim 1, wherein the bracket further includes an adjusting member installed to the shaft and the head portion of the pincette is secured to the adjusting member in such a configuration that the pincette linearly moves in accordance with a rotation of the adjusting member about the shaft.

10. The apparatus of claim 1, wherein the controller includes an open angle controller positioned at a first side of the bracket and a reciprocating mover positioned at a second side opposite to first side of the bracket the bracket, so that the opening angle of the gripping portion of the pincette is controlled by the pressure applied by the controller.

11. The apparatus of claim 10, wherein the reciprocating mover applies the pressure to the gripping portion of the pincette from the second side of the bracket while the open angle controller supports the gripping portion of the pincette at the first side of the bracket.

12. The apparatus of claim 11, wherein the reciprocating mover applies the pressure to the gripping portion of the pincette by a piston operated by an air compressor or an electrical solenoid.

* * * * *